US010424433B2

(12) United States Patent
(10) Patent No.: US 10,424,433 B2
(45) Date of Patent: Sep. 24, 2019

Clements et al.

(54) ELECTROMAGNETIC COIL CONSTRUCTED FROM CONDUCTIVE TRACES ON PRINTED CIRCUIT BOARDS

(71) Applicant: The Boeing Company, Chicago, IL (US)

(72) Inventors: Kelton R. Clements, St. Peters, MO (US); Timothy M. Fleeger, St. Louis, MO (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 16/352,554

(22) Filed: Mar. 13, 2019

(65) Prior Publication Data

US 2019/0214183 A1 Jul. 11, 2019

Related U.S. Application Data

(62) Division of application No. 15/158,905, filed on May 19, 2016, now Pat. No. 10,276,293.

(51) Int. Cl.

*H01F 5/00* (2006.01)
*H01F 27/28* (2006.01)

(Continued)

(52) U.S. Cl.

CPC ......... *H01F 27/2804* (2013.01); *H01F 27/24* (2013.01); *H01F 27/306* (2013.01);

(Continued)

(58) Field of Classification Search

USPC .................................. 336/200, 232, 192, 83

See application file for complete search history.

(56) References Cited

U.S. PATENT DOCUMENTS 3,845,436 A 10/1974 Robin
5,777,539 A 7/1998 Folker et al.

(Continued)

OTHER PUBLICATIONS

"U.S. Appl. No. 15/158,905, Restriction Requirement dated Apr. 18, 2018", 7 pages.

(Continued)

*Primary Examiner* — Elvin G Enad
*Assistant Examiner* — Kazi S Hossain
(74) *Attorney, Agent, or Firm* — Kwan & Olynick LLP

(57) ABSTRACT

Traces, vias, or other conductive paths are formed on or through printed circuit boards or other insulating substrates to function as loops of an electromagnetic coil. The substrate itself insulates one side of each loop except at the inter-loop connection point, allowing the loops to be connected directly to each other. A ratio of trace width to depth may be selected to prevent or mitigate skin-effect losses at high operating frequencies. Nested sleeves on an insulated housing lengthen the surface distance between the coil and any nearby conductor such as an interior core or winding, presenting an effective obstacle to surface flashover between the coil and the nearby conductor. Optionally, field-shaping electrodes at the ends of the coil may discourage breakdown by reducing the electric field magnitude. Trace-based electromagnetic coils used as secondary windings in high-power transformers may be smaller than traditional wire-wound secondaries meeting similar voltage hold-off requirements.

20 Claims, 9 Drawing Sheets

(51) Int. Cl.

| | |
|---|---|
| ***H01F 41/04*** | (2006.01) |
| ***H01F 41/02*** | (2006.01) |
| ***H01F 27/24*** | (2006.01) |
| ***H01F 27/30*** | (2006.01) |

(52) U.S. Cl.

CPC ........... *H01F 41/02* (2013.01); *H01F 41/041* (2013.01); *H01F 2027/2809* (2013.01); *H01F 2027/2814* (2013.01)

(56) References Cited

U.S. PATENT DOCUMENTS

| | | | | |
|---|---|---|---|---|
| 7,248,138 | B2 | 7/2007 | Chiang et al. | |
| 7,903,432 | B2 | 3/2011 | Luo et al. | |
| 8,519,815 | B1 | 8/2013 | Sanders | |
| 2005/0212640 | A1* | 9/2005 | Chiang | H01F 27/2804 336/200 |
| 2010/0289610 | A1 | 11/2010 | Jacobson et al. | |
| 2013/0199027 | A1 | 8/2013 | Singh et al. | |
| 2014/0145813 | A1* | 5/2014 | Zhang | H01F 27/42 336/200 |
| 2015/0116950 | A1* | 4/2015 | Yoo | H05K 1/116 361/728 |
| 2017/0338027 | A1 | 11/2017 | Clements et al. | |

OTHER PUBLICATIONS

"U.S. Appl. No. 15/158,905, Examiner Interview Summary dated Dec. 5, 2018", 3 pages.

"U.S. Appl. No. 15/158,905, Non Final Office Action dated Oct. 11, 2018", 10 pgs.

"U.S. Appl. No. 15/158,905, Notice of Allowance dated Jan. 9, 2018", 8 pages.

"U.S. Appl. No. 15/158,905, Notice of Allowance dated Jan. 9, 2018", 8 pgs.

"European Application Serial No. 17170941.3, Office Action dated Feb. 27, 2019", 4 pgs.

"European Application Serial No. 17170941.3, Office Action dated Nov. 13, 2018", 5 pgs.

"European Application Serial No. 17170941.3, Partial Search Report dated Oct. 26, 2017", 14 pgs.

* cited by examiner

ELECTROMAGNETIC COIL CONSTRUCTED FROM CONDUCTIVE TRACES ON PRINTED CIRCUIT BOARDS

CROSS-REFERENCE TO RELATED APPLICATIONS

This application is a divisional of U.S. patent application Ser. No. 15/158,905, entitled: "Electromagnetic Coil Constructed from Conductive Traces on Printed Circuit Boards", filed on 2016 May 19, which is incorporated herein by reference in its entirety for all purposes.

BACKGROUND

Related fields include electromagnetic induction coils in general, and more particularly windings in transformers, including high-current transformers.

High-power transformers are used in power converters for aircraft, spacecraft, vessels, offshore platforms, vehicles, and similar isolated environments. High-power transformers may achieve high power density by operating at high voltage, high current, high frequency, or any combination. Under conditions where the electromagnetic coils must hold off high voltage without breakdown, conventional approaches used for low-power transformers become unwieldy. For example, traditional wire-wound secondary coils require longer and longer windings as the required voltage hold-off increases. Excessively long windings may become difficult to manufacture and require inconveniently large packages.

One approach to reducing the physical axial length of high-power secondary coils has been to overlap the windings. However, overlapping introduces its own performance challenges, such as the formation of inter-winding capacitances and a heightened risk of breakdown between the secondary and its inner core or, where applicable, primary windings around the core. Long, overlapped windings may also require complex and painstaking processes for fabrication and assembly.

SUMMARY

Provided are devices, such as electromagnetic coils, and method of fabricating thereof. An electromagnetic coil may include a first loop, a second loop, a first substrate, and a second substrate. The first loop may include a first trace disposed on a front surface of the first substrate, a first front contact on the first trace, a first conductive path from the first trace through the first substrate, and a first back contact disposed on a back surface of the first substrate. The second loop may include a second trace disposed on a front surface of the second substrate, a second front contact on the second trace, a second conductive path from the second trace through the second substrate, and a second back contact disposed on a back surface of the second substrate. In some embodiments, the first loop and the second loop may be substantially the same and may be interchangeable. In other words, the first loop may be used in place of the second loop, while the second loop may be used in place of the first loop. The first back contact may be conductively coupled to the second front contact.

The first substrate may include a printed circuit board. The use of printed circuit boards allows forming traces with specific dimensions and help with assembly of the overall device. The first trace may include copper, however, other conductive materials are also within the scope.

Each substrate may include one or more locating features used for establishing and maintaining a particular orientation between different substrates or, more specifically, between different loops on substrates thereby allowing electrical connections between front and back contacts of adjacent loops. For example, a first locating feature on the first substrate and a second locating feature on the second substrate may be aligned to each other. The first locating feature may include a first hole through the first substrate. The second locating feature may include a second hole through the second substrate. A rod may be inserted into the first hole and the second hole.

The electromagnetic coil may also include a third loop disposed a third substrate, a third front contact conductively coupled to the second back contact, and a third locating feature on the third substrate aligned to the second locating feature on the second substrate. The first trace may have a trace width at least two times greater than the trace depth. In some embodiments, the trace width is at least five times greater than the trace depth. The first back contact may be soldered to the second front contact.

Provided systems may include an electromagnetic coil, a frame around the electromagnetic coil, a first field-shaping element disposed at a first end of the electromagnetic coil, a second field-shaping element disposed at a second end of the electromagnetic coil, an electrical connection attached to at least one of the first field-shaping element or the second field-shaping element, and a housing interposing an insulating material between conductive materials outside the electromagnetic coil and at least one of the electromagnetic coil, the first field-shaping element, or the second field-shaping element.

The electromagnetic coil may include a plurality of loops formed as traces on a plurality of substrates and interconnected by conductive paths through the plurality of substrates. The frame may include a first spacer coupled to the first end of the electromagnetic coil, a second spacer coupled to the second end of the electromagnetic coil, and a rod coupling the first spacer to the second spacer. The rod may pass through holes in at least two of the plurality of substrates. The first field-shaping element may include a conductivity discontinuity interrupting a perimeter of an annular shape. The first end of the electromagnetic coil may include a conductive contact touching the first field-shaping element. The housing may include a plurality of component pieces that, when assembled, lengthen a minimum surface path from the electromagnetic coil to a nearest conductive surface to at least three times greater than a minimum physical separation between the electromagnetic coil and the nearest conductive surface.

The systems may also include a magnetic core with a first core leg extending axially through the electromagnetic coil. Optionally, the systems may additionally include an additional winding around the first core leg inside the electromagnetic coil.

Provided methods may include stacking a plurality of substrates, serially connecting a plurality of loops formed on them into an electromagnetic coil, assembling a frame around the electromagnetic coil, connecting each end of the electromagnetic coil to a field-shaping element, installing a housing that positions an insulating material on at least one side of field-shaping element and inside the electromagnetic coil, and inserting a first core leg through a sleeve in the housing. The stacking may include rotationally offsetting consecutive substrates to align the ends of loops to form serial connections. The ends of the loops may include front contacts disposed on front sides of the plurality of substrates and back contacts on back surfaces of the plurality of substrates.

Optionally, the methods may include applying solder to the ends of the loops during the stacking of the consecutive substrates, imposing compressive loading from each end of the coil toward a center of the electromagnetic coil, and heating the electromagnetic coil to cure the solder.

DETAILED DESCRIPTION

Figure 1A:
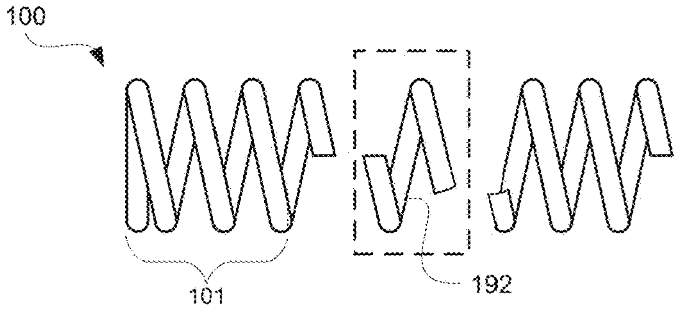
FIG. 1A symbolically illustrates electromagnetic coil 100, in accordance with some embodiments.

The following description provides a number of specific details of embodiments to further readers' understanding of the presented concepts. However, alternate embodiments of the presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

Definitions

As used herein:

"Annular" shall mean generally ring-shaped: possibly, but not necessarily, circular. The ring may instead be elliptical, oval, or some other round or round-cornered shape. The ring shape need not be complete, but may include one or more gaps.

"Back," "front," and other directional terms are used for convenience only, to help viewers locate features on objects in drawings; they do not limit the scope to certain orientations of the objects in space.

"Loop" shall mean an annular trace with terminations on either side of a gap in the perimeter. One of the terminations is connected to a via or other conductive path penetrating through a substrate.

"Loop Module" shall mean combination of the loop, its substrate, any locating features, and any other features or structures fabricated on or assembled to the substrate.

"Neighboring" shall mean "immediately adjacent and capable of touching."

"Stack" shall mean an aligned juxtaposition of two or more trace-based loops along an axis of any orientation (not necessarily vertical).

Introduction

Some applications of electromagnetic coils may benefit from replacing traditional wire windings with a connected series of modular pre-formed substrate-mounted loops. Loop-shaped traces may be formed on insulating substrates, such as printed circuit boards. One end of each loop may terminate in a via or another conductive path penetrating through the substrate and exposing a conductive end on the other side of the substrate. This conductive end may be connectable to a neighboring loop (or other neighboring component such as an electrode or lead) when the electromagnetic coil is assembled.

If there are no other conductive structures on the same side of the substrate as the conductive end (or at least none close enough to the conductive end to interact with the neighboring trace), the substrates themselves effectively insulate each loop from adjacent loops and/or other electrical components. This allows the loops to be connected directly to each other without a need for intermediate insulator. Compared to the alternative of feeding each connection through a separate inter-loop insulator, this approach reduces part count (including weight, size, and cost), assembly complexity, and in some cases physical footprint.

In some embodiments, the substrate may be a printed circuit board (PCB). The traces and conductive paths may be formed using PCB fabrication processes and PCB materials, such as copper. Such traces and vias may be made wide and deep enough to carry large currents and handle high frequencies with low loss. Unlike traditional wire, for which cost increases with diameter, little or no additional cost may attach to widening a PCB trace.

Breakdown becomes a greater issue as voltage increases, especially in a compact package. To discourage this, some embodiments of insulated housings for trace-based electromagnetic coils may include nested sleeves that lengthen the surface distance between the coil and any nearby conductive component such as a core or interior primary winding. The surface distance may be increased to many times (e.g., more than three times) the physical separation between the coil and the other conductive component, thus presenting an effective obstacle to surface flashover between the coil and other conductive elements. Optionally, field-shaping electrodes at the ends of the coil may discourage breakdown by reducing the electric field magnitude.

Overall, trace-based electromagnetic coils may be smaller, both in overall footprint and number of loops, in comparison to conventional wound coils. Furthermore, trace-based electromagnetic coils may be lighter in weight and easier to assemble. Another aspect of trace-based electromagnetic coils is that such coils can be assembly in various different configurations from standard set of parts, e.g., have different number of traces. Furthermore, trace-based electromagnetic coils are believed to be more reliable and efficient at high power densities than traditional windings.

EXAMPLES

FIG. 1A symbolically illustrates electromagnetic coil 100, in accordance with some embodiments. Electromagnetic coil 100 comprises plurality of loops 101. Each individual loop 192 may be connected in series with its neighboring loops when electromagnetic coil 100 is in assembled state. One having ordinary skill in the art would understand that electromagnetic coil 100 may include any number of individual loops 192.

Figure 1B:
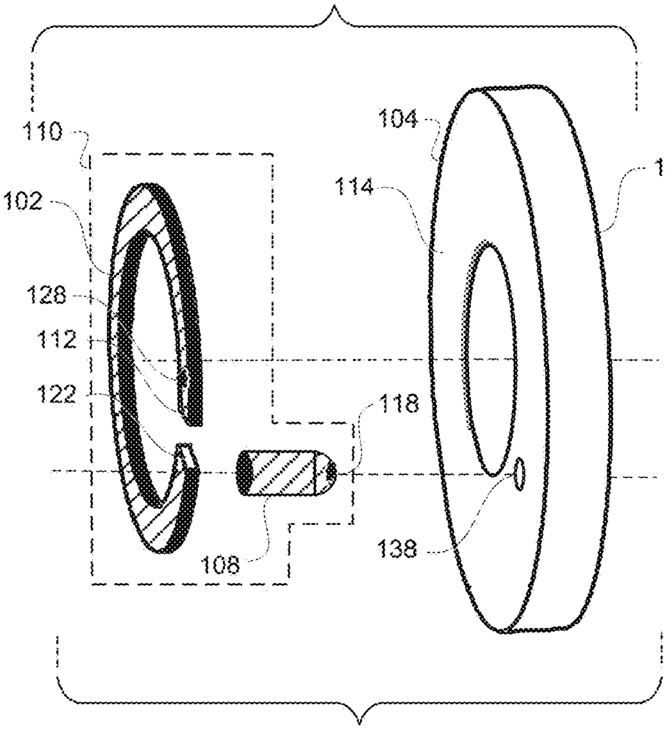
FIG. 1B is an exploded view of loop 110 created as a trace on and through a substrate, in accordance with some embodiments.

FIG. 1B is an exploded view of loop 110 created as a trace on and through a substrate, in accordance with some embodiments. This type of loop 110 may be referred to as a trace-based loop.

In some embodiments, loop 110 includes trace 102 disposed on front side 114 of substrate. Loop 110 also includes conductive path 108 protruding through substrate 104 from front side 114 to back side 124. Conductive path 108 may include a via or pin protruding through opening 138 in substrate 104. Alternatively, conductive path 108 may be formed in the bulk material of substrate 124, e.g., by doping, impregnating with particles, or any other suitable known way to increase the conductivity of a localized area of substrate 104.

In some embodiments, trace 102 may be an incomplete annulus based on a circle, ellipse, oval, or some other rounded shape. A gap in the trace perimeter separates first termination 112 from second termination 122. Preferably, the gap between first termination 112 and second termination 122 is sufficiently large to prevent shorting between the terminations when electromagnetic coil 100 is operating. Near first termination 112 is front contact 128. Front contact 128 is a conductive area connected to trace 102. Depending on the embodiment, front contact 128 may be visually distinct, or alternatively front contact 128 may be a contiguous part of the surface of trace 102 in the vicinity of first termination 112. Second termination 122 is connected to conductive path 108, which penetrates through substrate 104 to terminate in back contact 118 on the opposite side of substrate 104, i.e., to the right in this illustration. Back contact 118 is a conductive area the end of conductive path 108 opposite trace 102. Depending on the embodiment, back contact 118 may be visually distinct, or alternatively back contact 118 may be a contiguous part of the trace-opposing end of conductive path 108. In some embodiments, conductive path 108 and trace 102 may be monolithic.

In some embodiments, substrate 104 may include a printed circuit board. Loop 110 may include copper or a copper alloy formed by any known suitable method for forming conductive traces and/or vias on printed circuit boards.

Together, loop 110 and substrate 104 constitute loop module 120, so called because they are basic units that may be (though are not necessarily) made separately, joined together to form an electromagnetic coil, and in some embodiments may be removed and replaced separately.

Figure 1C:
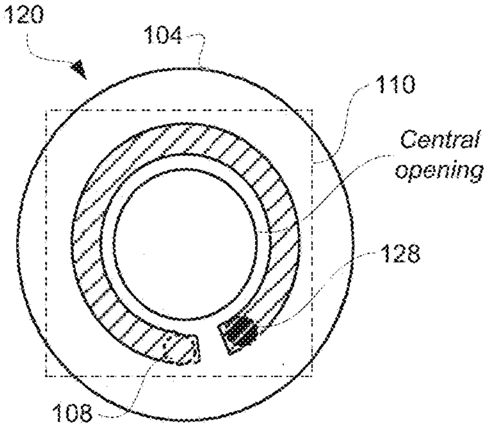
FIG. 1C is a front view of a loop module, in accordance with some embodiments.

FIG. 1C is a front view of a loop module, in accordance with some embodiments. Loop module 120 includes substrate 104 and loop 110. Trace 102 of loop 110 is facing forward, in front of substrate 104. Conductive path 108 of loop 110 is hidden behind second termination 122. In some embodiments, such as where trace 102 is bare, front contact 128 of loop 110 may not be visibly distinguishable from the rest of the front surface of trace 102. However, in some embodiments, such as where trace 102 is covered or treated to make its surface less conductive, front contact 128 may be visibly distinguishable as a bare area.

Figure 1D:
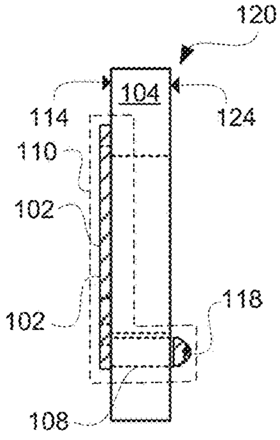
FIG. 1D is a side view of loop module 120, in accordance with some embodiments.

FIG. 1D is a side view of loop module 120, in accordance with some embodiments. In loop module 120, trace 102 is formed on front side 114 of substrate 104. Conductive path 108 is connected to trace 102 and protrudes through substrate 104 from front side 114 to back side 124, to terminate in back contact 118.

Figure 2A:
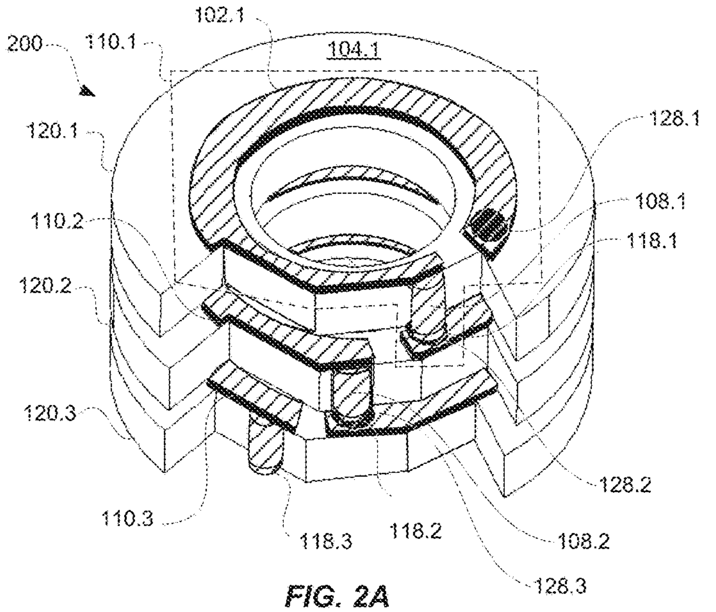
FIG. 2A is a cut-away view of a stack of loop modules, in accordance with some embodiments.

FIG. 2A is a cut-away view of a stack of loop modules, in accordance with some embodiments. Specifically, three loop modules 120.1, 120.2, and 120.3 are shown. Front loop module 120.1 of stack 200 may include trace 102.1 formed on substrate 104.1, front contact 128.1 on the outward face of trace 102.1, conductive path 108.1 protruding through substrate 104.1 from trace 102.1, and back contact 118.1 at the end of conductive path 108.1. Center loop module 120.2 and back loop module 120.3 of stack 200 have similar features, though not all are visible in this view. Serial connection of center loop 110.2 to back loop 110.3 may include conductively coupling back contact 118.2 of center loop module 120.2 to front contact 128.3 of back loop module 120.3. Serial connection of center loop 110.2 to front loop 110.1 may include conductively coupling front contact 128.2 of center loop module 120.2 to back contact 118.1 of front loop module 120.1. Additionally, note the staggered angular positions of the connections of front contacts 128.1-128.3 to back contacts 118.1-118.3, a consequence of the built-in offset between the front contact and back contact of each loop.

Figure 2B:
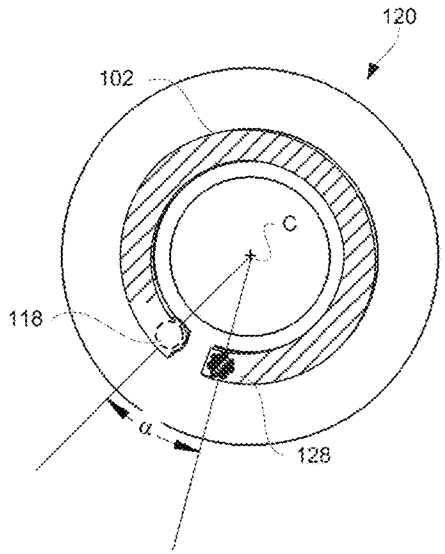
FIG. 2B is a front view of loop module 120, in accordance with some embodiments.

FIG. 2B is a front view of loop module 120, in accordance with some embodiments. With respect to center C, front contact 128 and back contact 118 are separated by angle $\alpha$. Thus, each successive loop in the series will be rotated by $\alpha$ from the loop behind it and by—$\alpha$ from the loop in front of it. Moreover, the loops may preferably be secured in those relative orientations for transport and operation to avoid accidental misalignment that could cause disconnection.

Figure 2C:
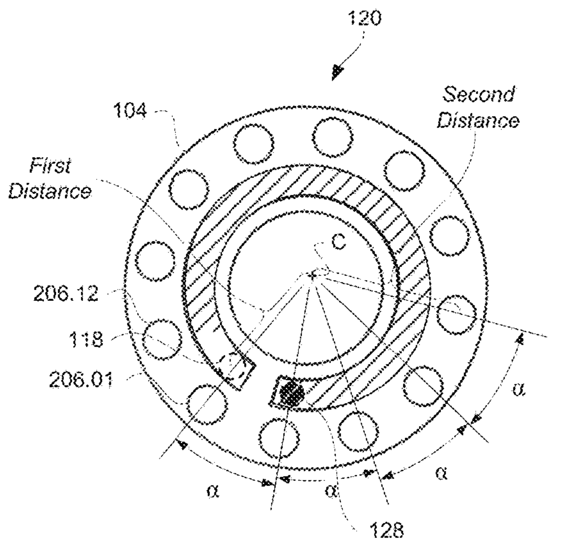
FIG. 2C is a front view of loop module 120 with locating features 206, in accordance with some embodiments.

FIG. 2C is a front view of loop module 120 with locating features 206, in accordance with some embodiments. In the illustration, rotational offset $\alpha$ between successive loops is 30°, or 360°/12. Locating features 206.01-206.12 may include or be in the form of holes, are placed around the perimeter of substrate 104 at 30° intervals. Alternatively, any other rotational offset that divides 360° into a whole number of segments can be used. A rod that can pass through the holes with, e.g., a running-and-sliding fit can be used in assembly to "string" successive loops together. For example, locating feature 206.12 of a first loop may be placed over the rod and locating feature 206.01 of a second loop may be placed over the rod. This placement would position the back contact of the second loop proximate to the front contact of the first loop. Alternatively, a set of loops may be aligned and connected with all the holes empty, after which a binding rod is inserted through one or more of the aligned series of holes to secure the alignment and connection of the separate loops.

Holes are but one example of a variety of usable locating features. Locating features may also include pegs, pins, slots, snaps, notches, and the like anywhere on the substrate—including the outer or inner edge—or any other known type of locating feature capable of aligning the loops and/or securing the alignment.

Figure 3A:
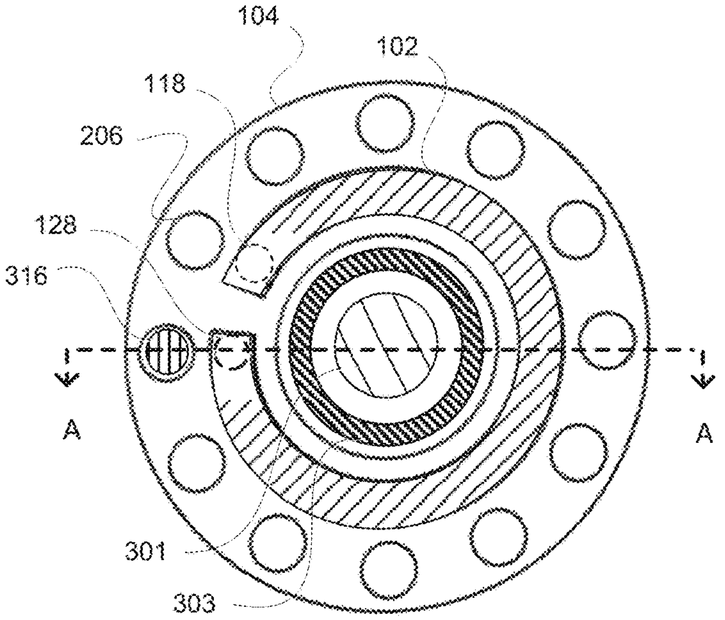
FIG. 3A is a front view of a trace-based electromagnetic coil as a secondary coil of a transformer with primary windings around a shared core, in accordance with some embodiments.

Trace-based electromagnetic coils may be used in a variety of systems in place of (or along with) traditional wire windings: inductors, electromagnets, sensors, and others. The following descriptions of trace-based electromagnetic coils as secondary coils in high-power-density transformers are intended to be illustrative rather than limiting FIG. 3A is a front view of a trace-based electromagnetic coil as a secondary coil of a transformer with primary windings around a shared core, in accordance with some embodiments. Substrates 104 are aligned to connect back contacts 118 with neighboring front contacts 128. Rod 316 passes through an aligned series of locating features 206 in the stack of aligned, connected substrates 104. The centers of substrates 104 inside traces 102 are hollow, creating a tunnel into which core 301 and/or additional (e.g., primary) windings 303 may be inserted. (Because these particular figures are intended to show only a basic configuration, they do not show housings, large air gaps, or other practical measures to prevent breakdown between the secondary coil and core 301 or primary winding 303. However, design approaches with such considerations is discussed with reference to later figures).

Figure 3B:
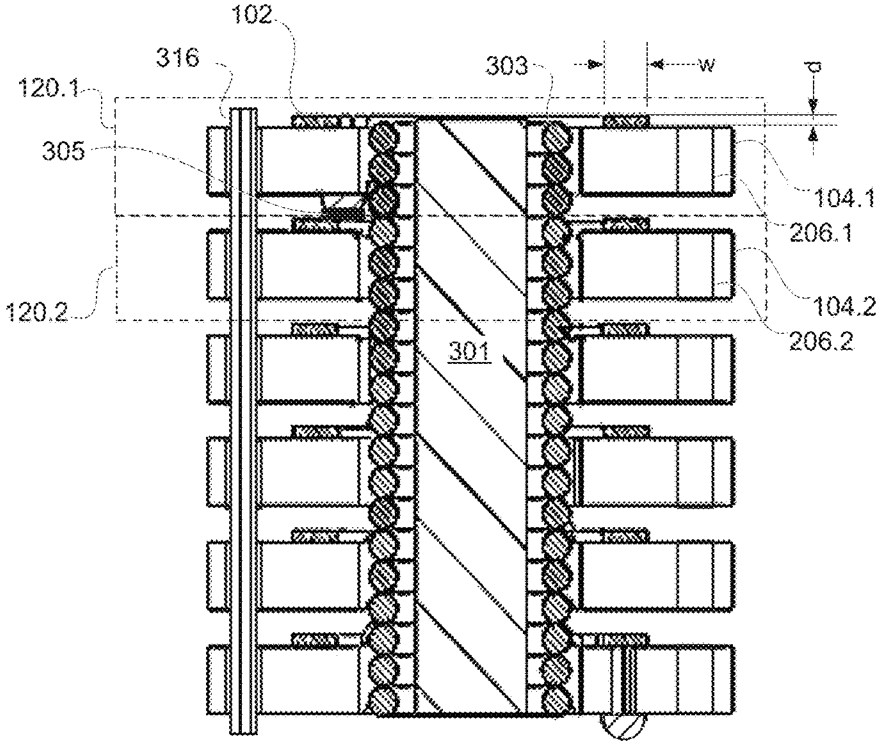
FIG. 3B is a section view through section A-A of FIG. 3A, in accordance with some embodiments.

FIG. 3B is a section view through section A-A of FIG. 3A, in accordance with some embodiments. This view shows locating features 206.1, 206.2 being openings in substrates 104.1, 104.2 align. Rod 316 passes through similar holes diametrically opposed locating features 206.1 and 206.2 to secure the alignment of loop modules 120.1, 120.2. Core 301 may be made of a magnetic material such as ferrite. Additional (e.g., primary) winding 303 may be a traditional wire winding as illustrated, or alternatively, may be a second trace-based winding. Neighboring loop modules 120.1, 120.2 are connected by solder 305 in some embodiments.

In some embodiments, trace width w and trace depth d may be dimensioned to offer low impedance to high current, and also to reduce skin-effect losses at high frequencies. As frequency rises, current becomes more concentrated at the surface of a trace than in the interior of the trace, increasing $I^2R$ losses. Specifically, the current density varies exponentially with depth toward the centerline of the trace.

Skin depth is the depth at which a hollow conductor carrying DC current would have the same loss as the trace carrying AC at the operating frequency. In effect, as the current density decreases along the centerline and increases along the surface, the trace begins to behave as if it has been hollowed out. For example, the skin depth for copper at 100 C, the skin depth is given by:

$$D_S = \frac{7.42}{\sqrt{f}}$$

where the skin depth $D_S$ is in cm and the frequency f is in Hz.

Making the trace both wider and deeper than the skin depth may not necessarily lower the losses to the extent desired. However, PCB traces tend to have rectangular (or near-rectangular) cross-section. In rectangular conductors, the magnetic field causing the eddy currents that produce the skin effect may be concentrated more at the corners than at the sides; therefore, wide shallow "ribbon" conductors conduct more current while generating less waste heat than conductors with square or round profiles. The aspect ratio of the trace cross-section may be selected accordingly. For example, the trace width may be at least twice the trace depth, or more depending of the frequency.

Figure 4:
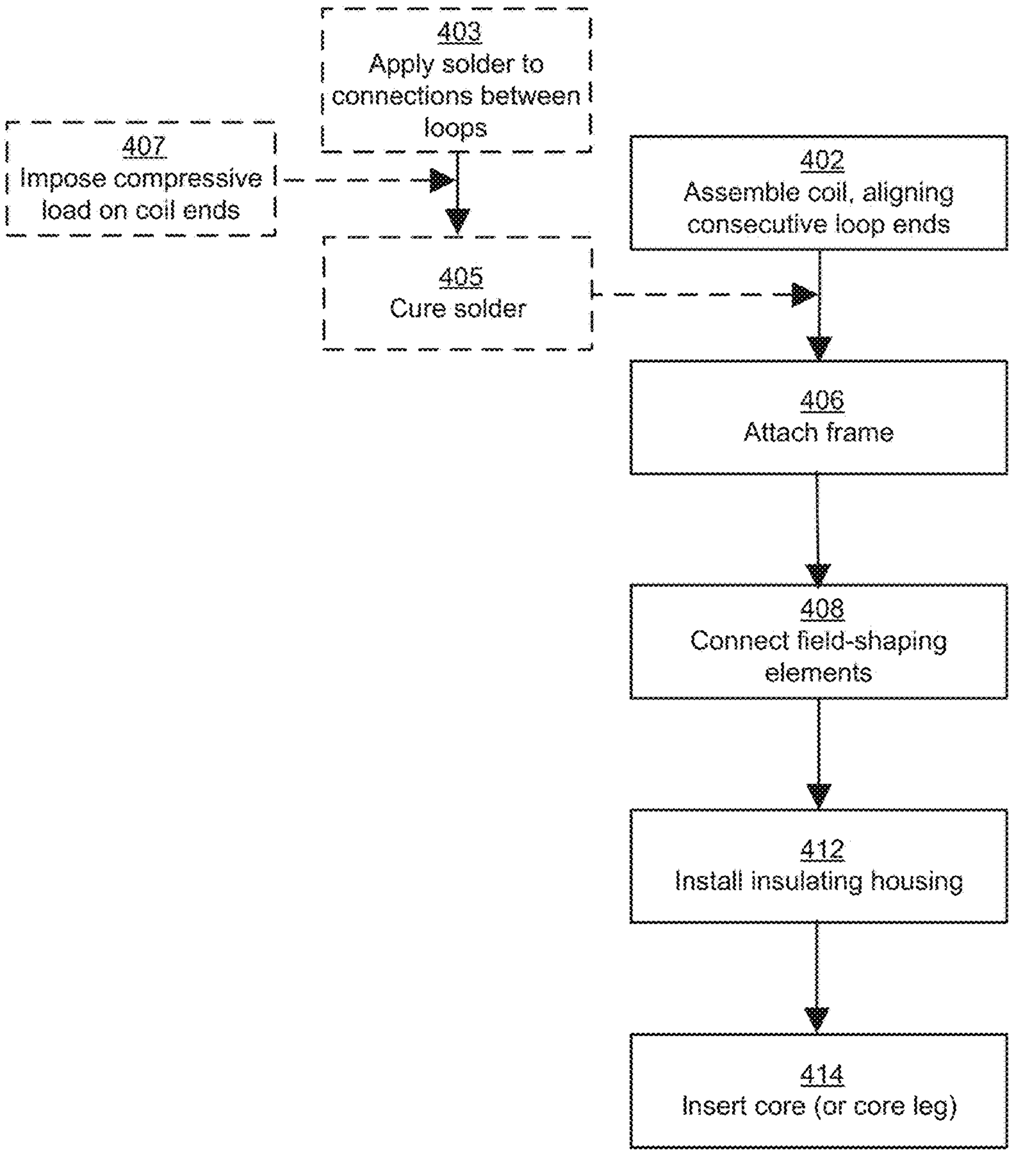
FIG. 4 is a flowchart for assembling a transformer with a trace-based electromagnetic coil, in accordance with some embodiments.

FIG. 4 is a flowchart for assembling a transformer with a trace-based electromagnetic coil, in accordance with some embodiments.

In some embodiments, operation 402 may involve stacking a plurality of substrates to serially connect a plurality of loops fabricated thereon into an electromagnetic coil. The stacking may include rotationally offsetting consecutive substrates, thereby aligning ends of loops on the consecutive substrates to connect the loops in series.

Optional operation 403 may involve applying solder to the ends of the loops during the stacking of the consecutive substrates. Optional Operation 405 may include imposing compressive loading on the coil from each of the ends. Optional Operation 407 may include heating the electromagnetic coil during the compressive loading, thereby curing the solder.

Operation 406 may involve assembling a frame around the electromagnetic coil. The frame may include one or more binding rods or other parts designed to engage with locating features on the substrates and secure the alignment of the loop modules and connection of the loops.

Operation 408 may involve terminating each end of the coil with an electrical connection to a field-shaping element. For example, the electrical connection may be soldered or spring-loaded. In some embodiments, the end of the coil may engage with a relatively large conductive surface of the field-shaping element instead of to a relatively small feature attached to the field-shaping element, thereby reducing the position sensitivity of the connection and relaxing the relevant tolerances.

Operation 412 may involve installing a housing that interposes an insulating material around each field-shaping element and inside the electromagnetic coil. In some embodiments, the housing may also insulate the trace-based electromagnetic coil and/or the field-shaping element from electric fields that may be present outside their outer perimeter.

Operation 414 may involve inserting a first core leg through a sleeve in the housing. In some embodiments, a single-leg core may be used and the first leg may be the only leg.

Figure 5A:
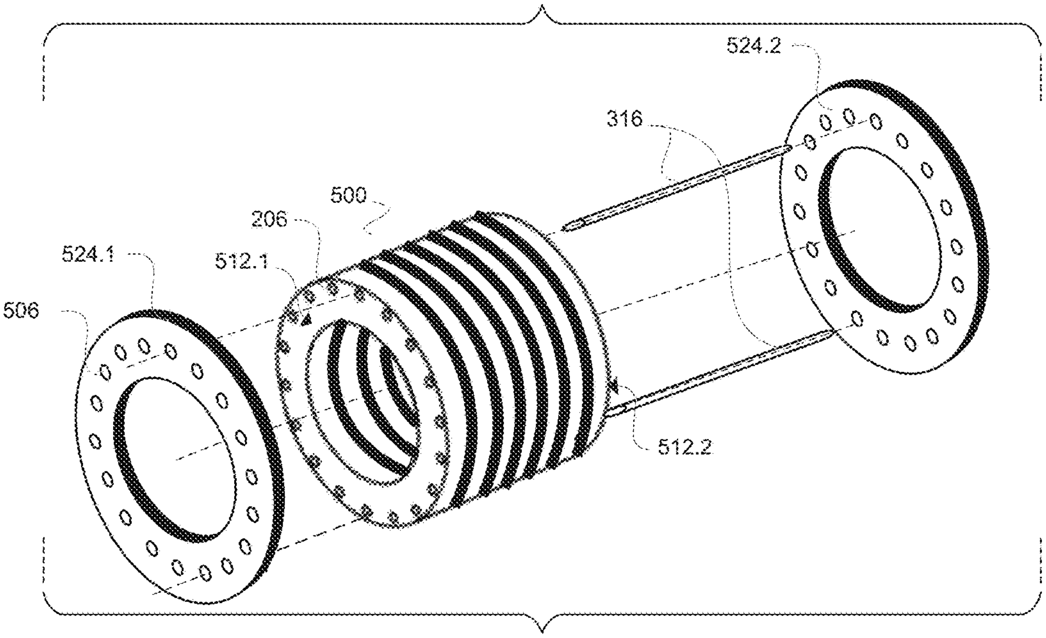
FIG. 5A is an exploded view of a trace-based electromagnetic coil and its frame components, in accordance with some embodiments.

FIG. 5A is an exploded view of a trace-based electromagnetic coil and its frame components, in accordance with some embodiments. Together, rods 316 and spacers 524.1, 524.2 may constitute a frame for electromagnetic coil 500.

The modular loop stack of electromagnetic coil 500 is assembled and aligned with its loops connected and locating features 206 in position for engagement with rods 316. Rods 316 will be threaded through locating feature 206 and attached to spacers 524.1, 524.2 at the ends 512.1, 512.2 of electromagnetic coil 500. In some embodiments, spacers 524.1, 524.2 also include spacer locating features 506 positioned to align or mate with locating features 206 of electromagnetic coil 500. Spacers are one example of a general class of adjacent components that may electrically or mechanically couple to loop modules by making use of matching or complementary locating features. Characteristics of spacers 524.1, 524.2 determine the compression of the trace-based electromagnetic coil. For example, a 5/64 G-10 spacer may produce about 91% compression.

Figure 5B:
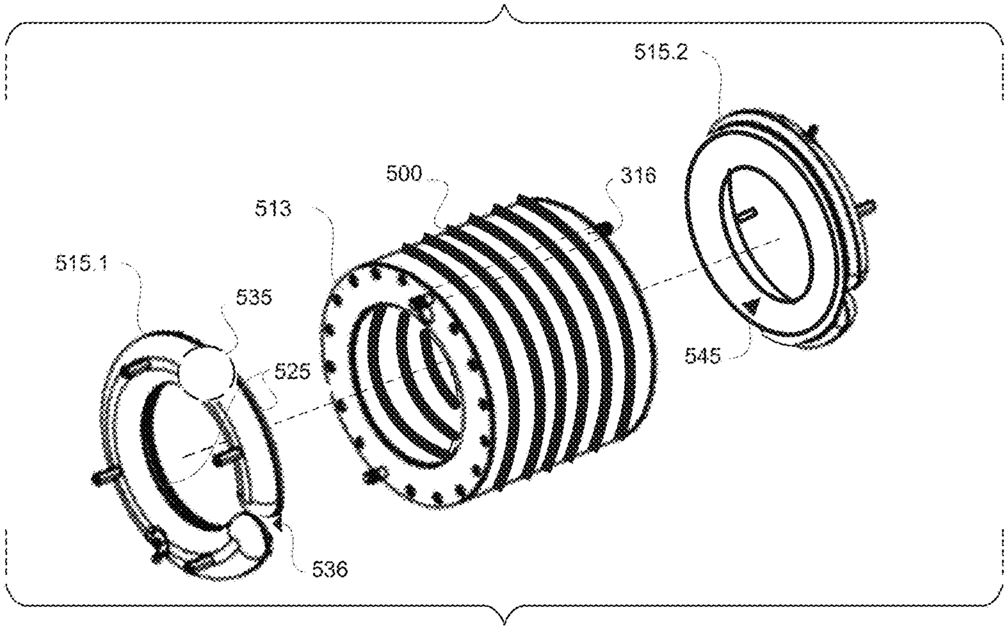
FIG. 5B is an exploded view of the coil/spacer assembly and its field-shaping elements, in accordance with some embodiments.

FIG. 5B is an exploded view of the coil/spacer assembly and its field-shaping elements, in accordance with some embodiments. Electromagnetic coil 500 is assembled into the frame 513 constructed by rods 316 and spacers 524.1, 524.2. The next operation may be to attach and connect field-shaping elements 515.1, 515.2. In some embodiments, field-shaping elements 515.1, 515.2 have annular shapes with blunt edges 525, a conductivity discontinuity 536 (e.g., an air gap as illustrated or a gap wholly or partially filled with an insulating material) somewhere along its perimeter, or other features known to effectively grade high-magnitude electric fields. Field-shaping elements 515.1, 515.2 may also include electrical connection 535 to electromagnetic coil 500. Electrical connection 535 may be spring-loaded, soldered, connected by screws or other fasteners, or otherwise mechanically and electrically coupled. In some embodiments, inner surfaces 545 may be flat to conductively couple to electromagnetic coil 500 anywhere on the perimeter between an inner radius and an outer radius.

Figure 5C:
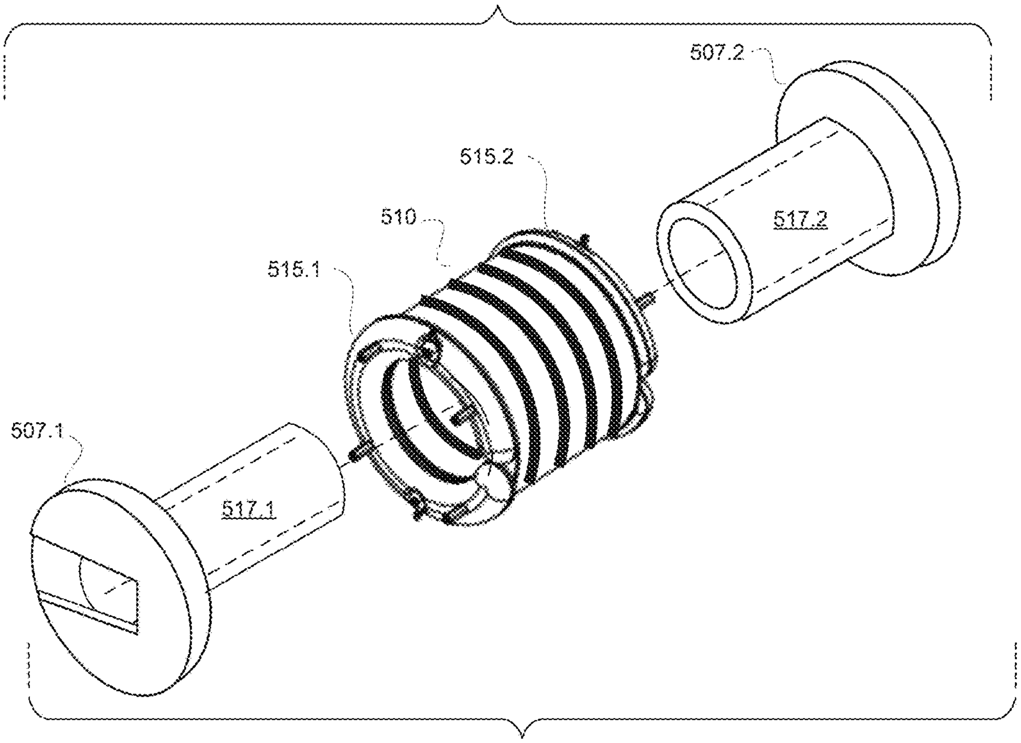
FIG. 5C is an exploded view of the coil/spacer/field-shaper assembly and component pieces of its housing, in accordance with some embodiments.

FIG. 5C is an exploded view of the coil/spacer/field-shaper assembly and component pieces of its housing, in accordance with some embodiments. Framed electromagnetic coil 510 is conductively coupled to field-shaping elements 515.1 and 515.2. Component pieces 507.1, 507.2 of an insulating housing may then be installed with flanges protecting field-shaping elements 515.1, 515.2 and sleeves 517, 537 going into the central opening of framed electromagnetic coil 510 to prevent breakdown between framed electromagnetic coil 510 and any separate conductive components located in the central opening.

Figure 5D:
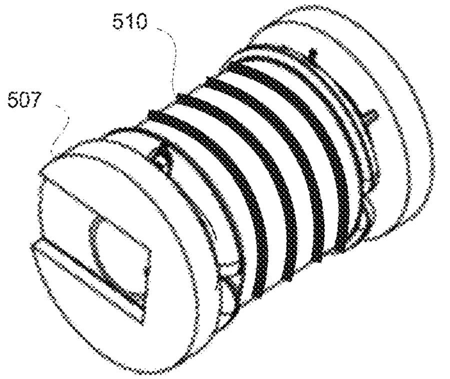
FIG. 5D is a perspective view of the coil/spacer/field-shaper/housing assembly, in accordance with some embodiments.

FIG. 5D is a perspective view of the coil/l spacer/field-shaper/housing assembly, in accordance with some embodiments. Component pieces 507.1 and 507.2 from FIG. 5*c* are assembled to make housing 507. Sleeves 517, 537 (see FIG. 5C) of housing 507 are fully inserted in the central opening of electromagnetic coil 510, bringing the end flanges of housing 507 against field-shaping elements 515.1, 515.2.

Figure 5E:
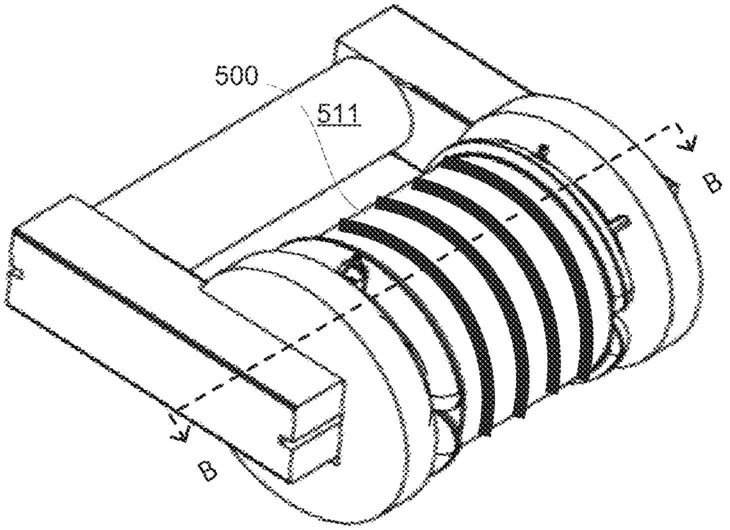
FIG. 5E is a perspective view of the assembly mounted on one leg of a two-leg core, in accordance with some embodiments.

FIG. 5E is a perspective view of the assembly mounted on one leg of a two-leg core, in accordance with some embodiments. A first core leg may be inside electromagnetic coil 500 surrounded by sleeves of the insulated housing. Second core leg 511 may be available for, e.g., a primary winding.

Figure 5F:
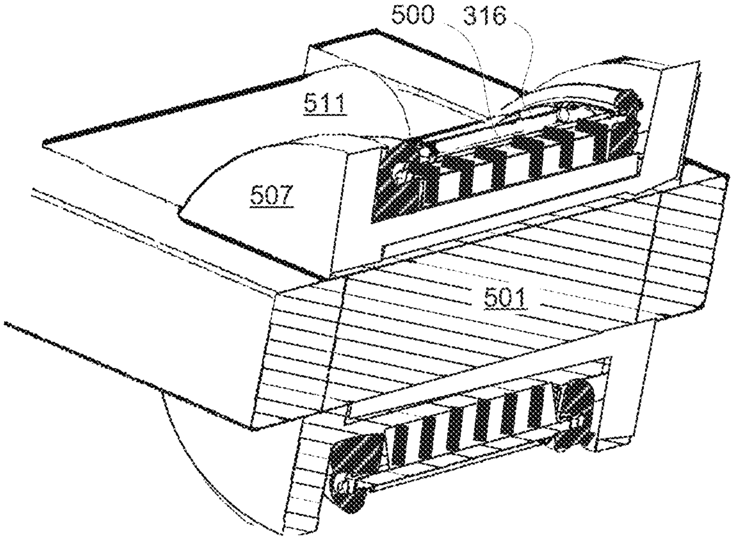
FIG. 5F is a section view through section B-B of FIG. 5E, in accordance with some embodiments.

FIG. 5F is a section view through section B-B of FIG. 5E, in accordance with some embodiments. Housing 507 insulates electromagnetic coil 500 from core 501. This view also shows rod 316 inserted through the locating feature in the substrates of electromagnetic coil 500.

At high power densities, multi-component insulating structures may offer “creep paths” for surface currents at their interfaces. Interfaces between parts of insulators may have lower impedance than the insulator bulk material. If the surface currents from the trace-based electromagnetic coil traverse a surface path and reach a core or internal primary winding at an above-threshold magnitude, breakdown may occur even if the insulator remains intact. However, the magnitude of a surface current drops as the surface path lengthens. If multi-part housings are used, breakdown from surface current may be discouraged by lengthening surface paths between the coil and any nearby conductive structure. For example, the profiles of mating parts may be designed to make the minimum surface path at least three times the length of the physical separation between the coil and the other conductor.

Figure 6A:
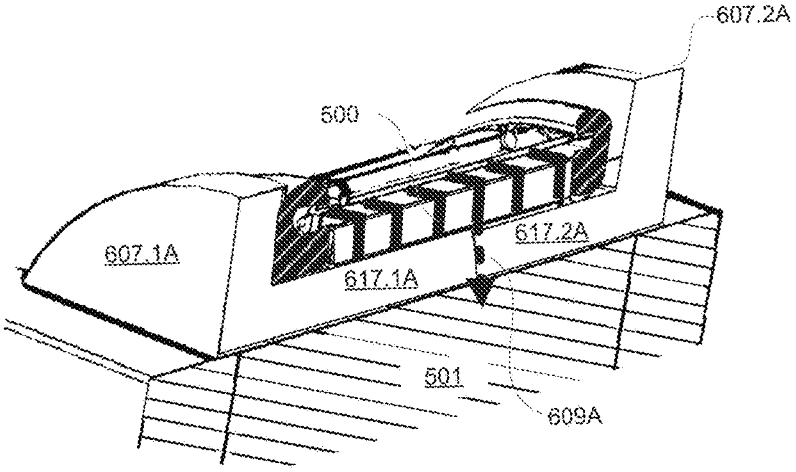
FIG. 6A is a section view through section B-B of FIG. 5E where the housing component pieces are in perpendicular contact, in accordance with some embodiments.

FIG. 6A is a section view through section B-B of FIG. 5E where the housing component pieces are in perpendicular contact, in accordance with some embodiments. Sleeves 607.1A, 617.2A of housing component pieces 607.1A, 607.2A simply butt together with a perpendicular interface. To cause a surface flash-over from electromagnetic coil 500 to core 501, a surface current would need to traverse surface path 609A, which at some points along electromagnetic coil 500 is about equal to the physical separation between trace-based electromagnetic coil 500 and core 501. At high power densities, surface currents might be strong enough to traverse surface path 609A and cause flash-over.

Figure 6B:
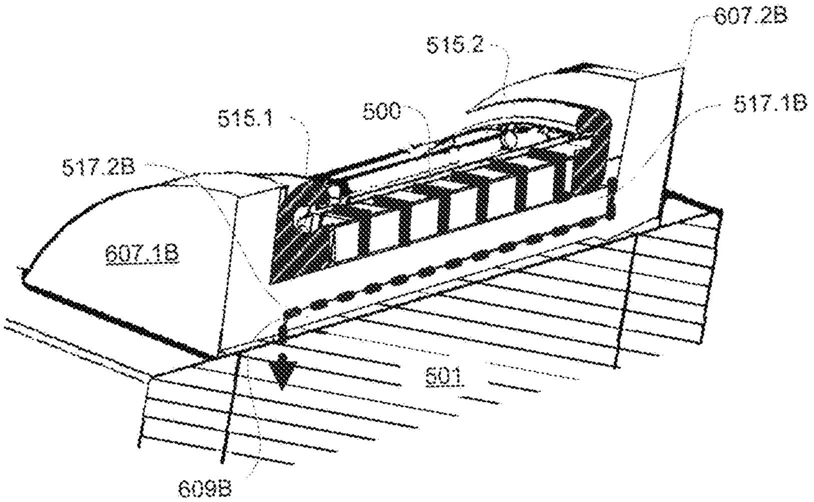
FIG. 6B is a section view through section B-B where the housing component pieces are nested to lengthen the surface path from the trace-based electromagnetic coil to the core, in accordance with some embodiments.

FIG. 6B is a section view through section B-B where the housing component pieces are nested to lengthen the surface path from the trace-based electromagnetic coil to the core, in accordance with some embodiments. The sleeves 517.1B, 517.2B of housing component pieces 507.1B, 507.2B, as in FIG. 5C, run the entire length of electromagnetic coil 500 and field-shaping elements 515.1, 515.2. Additionally, sleeves 517.1B and 517.2B have different inner and outer diameters such that sleeve 517.2B slides into sleeve 517.1B. Using these longer, nested sleeves, the minimum surface path for flash-over becomes surface path 609B, which is much longer than surface path 609A in FIG. 6A and indicates a decrease in the risk of flash-over at high power densities compared to the assembly in FIG. 5A.

Figure 6C:
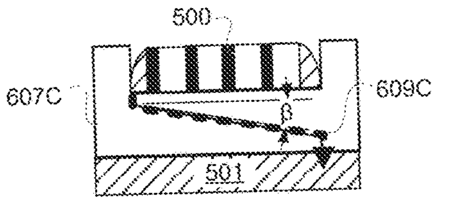
FIGS. 6C and 6D illustrate some housings with alternate types of nesting sleeves to lengthen the surface path from the trace-based electromagnetic coil to the core, in accordance with some embodiments.
Figure 6D:
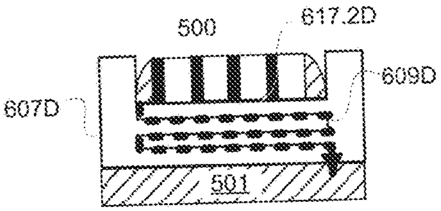

FIGS. 6C and 6D illustrate some housings with alternate types of nesting sleeves to lengthen the surface path from the trace-based electromagnetic coil to the core, in accordance with some embodiments. In both, trace-based electromagnetic coil 500 and core 501 are included for context. In FIG. 6C, the sleeves of housing 607C meet at an angle β, which may act as a draft angle to guide the component pieces into the nesting configuration during assembly and may also help to lengthen surface path. 609C. In FIG. 6D, extra switchbacks are added to lengthen surface path 609D by double-walling the sleeves of housing 607D. Those skilled in the art will recognize other equivalent ways to lengthen the surface path to at least 3× the physical separation between the trace-based electromagnetic coil and the core or interior primary windings by altering the profiles of nested sleeves; these, too, are within the scope of disclosure.

Examples of Aircraft and Methods of Fabricating and Operating Aircraft

Figure 7A:
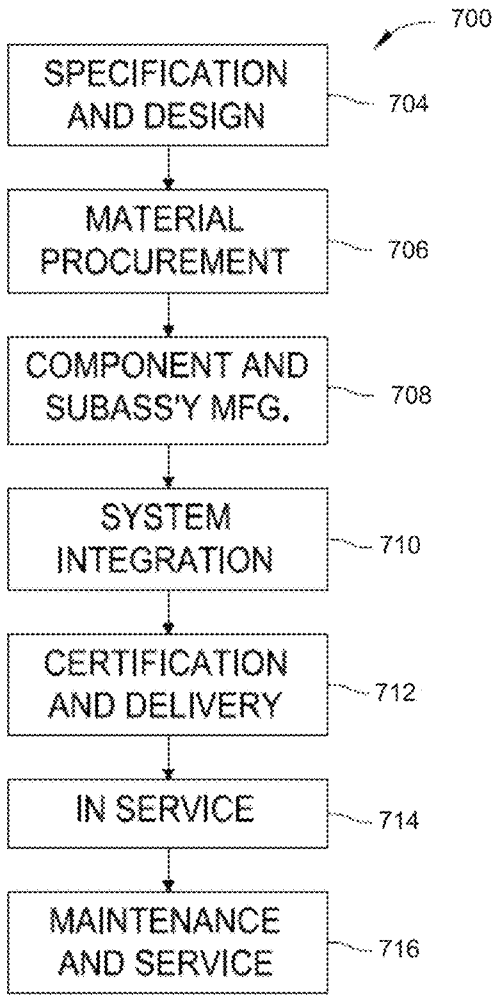
FIG. 7A is a flowchart of aircraft manufacturing and use, in accordance with some embodiments.
Figure 7B:
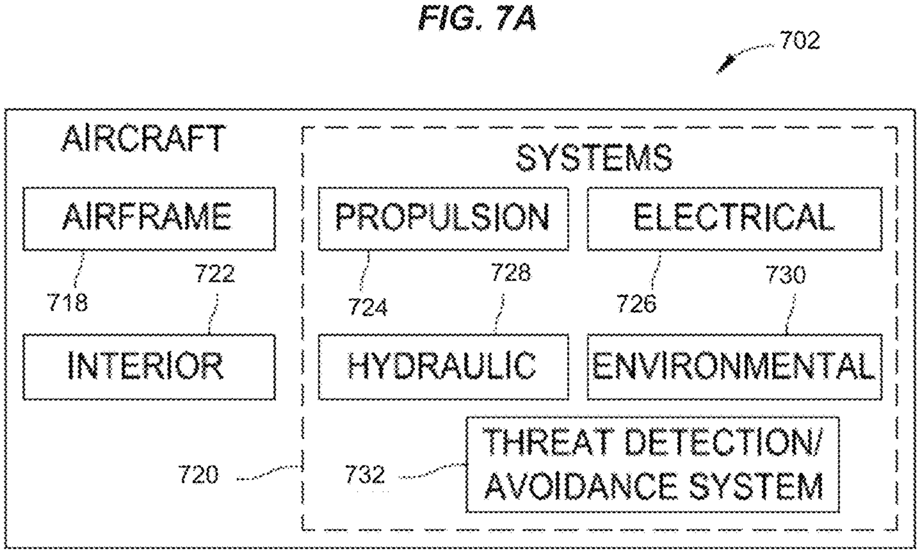
FIG. 7B is a block diagram of aircraft systems, in accordance with some embodiments.

Examples of the present disclosure may be described in the context of aircraft manufacturing and service method 700 as shown in FIG. 7A and aircraft 702 as shown in FIG. 7B.

FIG. 7A is a flowchart of aircraft manufacturing and use, in accordance with some embodiments. During pre-production, illustrative method 700 may include block 704, specification and design of aircraft 702 and block 706, material procurement. During production, block 708 of component and subassembly manufacturing and block 710 of inspection system integration of aircraft 702 may take place. Thereafter, aircraft 702 may go through block 712 of certification and delivery to be placed in service at block 714. While in service, aircraft 702 may be scheduled for block 716, routine maintenance and service. Routine maintenance and service may include modification, reconfiguration, refurbishment, etc. Of aircraft 702.

Each of the processes of illustrative method 700 may be performed or carried out by an inspection system integrator, a third party, and/or an operator (e.g., a customer). For the purposes of this description, an inspection system integrator may include, without limitation, any number of aircraft manufacturers and major-inspection system subcontractors; a third party may include, without limitation, any number of vendors, subcontractors, and suppliers; and an operator may be an airline, leasing company, military entity, service organization, and so on.

FIG. 7B is a block diagram of aircraft systems, in accordance with some embodiments. Aircraft 702 produced by illustrative method 700 may include airframe 718 with a plurality of high-level inspection systems 720 and interior 722. Examples of high-level inspection systems 720 include one or more of propulsion inspection system 724, electrical inspection system 726, hydraulic inspection system 728, and environmental inspection system 730. Any number of other inspection systems may be included. Although an aerospace example is shown, the principles disclosed herein may be applied to other industries, such as the automotive industry. Accordingly, in addition to aircraft 702, the principles disclosed herein may apply to other vehicles, e.g., land vehicles, marine vehicles, space vehicles, etc.

Apparatus and methodology shown or described herein may be employed during any one or more of the stages of manufacturing and service method 700. For example, components or subassemblies corresponding to block 708, component and subassembly manufacturing, may be fabricated or manufactured in a manner similar to components or subassemblies produced while aircraft 702 is in service as in block 714. Also, one or more examples of the apparatus, methodology, or combination thereof may be utilized during production stages illustrated by block 708 and block 710, for example, by substantially expediting assembly of or reducing the cost of aircraft 702. Similarly, one or more examples of the apparatus or method realizations, or a combination thereof, may be utilized, for example and without limitation, while aircraft 702 is in service as in block 714 and/or during maintenance and service as in block 716.

CONCLUSION

Different examples disclosed herein may include a variety of components, features, and functionalities. It should be understood that it may be possible for some or all of the individual examples to alternatively include one or more components, features, or functionalities described with reference to other examples. Regardless of whether these alternative components, features, or functionalities are substituted singly or in any combination, all of such possibilities are intended to be included in the spirit and scope of the present disclosure.

Modifications of the disclosed examples may occur to one skilled in the disclosure's pertinent art after gaining the benefit of the teachings presented in the foregoing descriptions and the associated drawings. However, it is to be understood that the scope of the present disclosure is not limited to the specific examples described or illustrated. Modifications and different combinations of elements and/or functions are intended to be included in the scope of the appended claims. Accordingly, any parenthetical reference numerals in the appended claims are intended to demonstrate how an illustrated example may represent a single embodiment of the claimed subject matter, not to limit the claim scope to the illustrated example.

What is claimed is:

1. A transformer comprising:

an electromagnetic coil, comprising a first loop module and a second loop module, wherein:

the first loop module comprises a first substrate and a first loop, the first substrate comprises a first front side and a first back side, opposite of the first front side, the first loop comprises a first trace, disposed on the first front side of the first substrate and comprising a first front contact, the first loop further comprises a first conductive path, extending through the first substrate and comprising a first back contact, the second loop module comprises a second substrate and a second loop, the second substrate comprises a second front side, facing the first back side of the first substrate, and a second back side, opposite of the second front side, the second loop comprises a second trace, disposed on the second front side of the second substrate and comprising a second front contact, conductively coupled to the first back contact, and the second loop further comprises a second conductive path, extending through the second substrate and comprising a second back contact; and a frame, positioned around the electromagnetic coil;

a first field-shaping element, disposed at a first end of the electromagnetic coil;

a second field-shaping element disposed at a second end of the electromagnetic coil;

an electrical connection attached to at least one of the first field-shaping element or the second field-shaping element; and a housing, formed from an insulating material and disposed outside the electromagnetic coil and at least one of the electromagnetic coil, the first field-shaping element, or the second field-shaping element.

2. The transformer of claim 1, wherein the frame comprises a first spacer coupled to the first end of the electromagnetic coil, a second spacer coupled to the second end of the electromagnetic coil, and a rod coupling the first spacer to the second spacer.

3. The transformer of claim 2, wherein the rod passes through holes in the first substrate and the second substrate.

4. The transformer of claim 1, wherein the first field-shaping element comprises a conductivity discontinuity interrupting a perimeter of an annular shape.

5. The transformer of claim 4, wherein the first end of the electromagnetic coil comprises a conductive contact touching the first field-shaping element.

6. The transformer of claim 1, wherein the housing comprises a plurality of component pieces that, when assembled, lengthen a minimum surface path from the electromagnetic coil to a nearest conductive surface to at least three times greater than a minimum physical separation between the electromagnetic coil and the nearest conductive surface.

7. The transformer of claim 1, further comprising a magnetic core having a first core leg extending axially through the electromagnetic coil.

8. The transformer of claim 7, further comprising an additional winding around the first core leg inside the electromagnetic coil.

9. The transformer of claim 1, wherein the first field-shaping element is disposed over the first loop module and electrically connected the first front contact of the first trace of the first loop.

10. The transformer of claim 1, wherein each of the first field-shaping element and the second field-shaping element has an annular shape and a conductivity discontinuity and comprises one or more blunt edges.

11. The transformer of claim 1, wherein:

the housing comprises at least a first component piece, comprising a first flange and a first sleeve;

the first flange is positioned over the first field-shaping element; and the first sleeve protrudes, at least partially, through the first loop module and the second loop module.

12. The transformer of claim 11, wherein the housing further comprises a second component piece, comprising a second flange and a second sleeve, at least partially protruding through the first loop module and the second loop module and overlapping with the first sleeve.

13. The transformer of claim 11, further comprising a core, comprising at least a first core leg protruding through the first loop module and the second loop module inside the first sleeve.

14. The transformer of claim 1, wherein the first loop module is rotationally offset relative to the second loop module such that the first front contact is rotationally offset relative to the second front contact.

15. The transformer of claim 1, wherein:

the first conductive path is offset a first distance from an axis of the electromagnetic coil;

the first substrate comprises a first plurality of locating feature openings, angularly offset by a set angle relative to each other around the axis of the electromagnetic coil;

each of the first plurality of locating feature openings is offset a second distance from the axis of the electromagnetic coil different from the first distance;

the second conductive path is offset the first distance from the axis of the electromagnetic coil;

the second substrate comprises a second plurality of locating feature openings, angularly offset by the set angle relative to each other around the axis of the electromagnetic coil; and each of the second plurality of locating feature openings is offset the second distance from the axis of the electromagnetic coil different from the second distance.

16. The transformer of claim 15, further comprising a rod, inserted through one of the first plurality of locating feature openings and one of the second plurality of locating feature openings, wherein the rod controls angular orientation of the first loop and the second loop relative to each other.

17. The transformer of claim 15, wherein an angular offset of the one of the first plurality of locating feature openings relative to the first conductive path is different from an angular offset of the one of the second plurality of locating feature openings relative to the second conductive path.

18. The transformer of claim 15, wherein the second distance is greater than the first distance.

19. The transformer of claim 15, wherein each of the first trace and the second trace is shaped as a semi-circle having a radius equal to the first distance.

20. The transformer of claim 15, wherein each of the first substrate and the second substrate comprises a central opening having a radius smaller than the first distance.

* * * * *